United States Patent
Liu et al.

(10) Patent No.: US 6,971,945 B2
(45) Date of Patent: Dec. 6, 2005

(54) MULTI-STEP POLISHING SOLUTION FOR CHEMICAL MECHANICAL PLANARIZATION

(75) Inventors: Zhendong Liu, Newark, DE (US); John Quanci, Haddonfield, NJ (US); Robert E. Schmidt, Bear, DE (US); Terence M. Thomas, Newark, DE (US)

(73) Assignee: Rohm and Haas Electronic Materials CMP Holdings, Inc., Wilmington, DE (US)

( * ) Notice: Subject to any disclaimer, the term of this patent is extended or adjusted under 35 U.S.C. 154(b) by 64 days.

(21) Appl. No.: 10/785,362

(22) Filed: Feb. 23, 2004

(65) Prior Publication Data

US 2005/0194357 A1    Sep. 8, 2005

(51) Int. Cl.⁷ ................................................. B24B 1/00
(52) U.S. Cl. ...................... 451/41; 451/36; 451/54; 451/65; 51/308; 51/309; 438/692; 438/693; 252/79.1
(58) Field of Search ............................ 451/36, 41, 54, 451/57, 59, 60, 63–65, 285–290, 444, 446; 438/692, 693; 252/79.1; 51/293, 307, 308, 51/309; 216/88, 89

(56) References Cited

U.S. PATENT DOCUMENTS

| | | | |
|---|---|---|---|
| 4,674,236 A | * | 6/1987 | Kawakami et al. ........... 451/56 |
| 4,910,155 A | * | 3/1990 | Cote et al. ...................... 438/16 |
| 4,954,142 A | | 9/1990 | Carr et al. |
| 5,244,534 A | * | 9/1993 | Yu et al. ....................... 438/672 |
| 5,340,370 A | * | 8/1994 | Cadien et al. ................. 51/308 |
| 5,733,177 A | * | 3/1998 | Tsuchiya et al. ............... 451/41 |
| 5,780,358 A | * | 7/1998 | Zhou et al. .................. 438/645 |
| 5,954,975 A | * | 9/1999 | Cadien et al. ................. 216/38 |
| 6,261,158 B1 | | 7/2001 | Holland et al. |
| 6,303,049 B1 | | 10/2001 | Lee et al. |
| 6,602,117 B1 | | 8/2003 | Chopra et al. |
| 2003/0116446 A1 | | 6/2003 | Duboust et al. |
| 2004/0147118 A1 | | 7/2004 | Liu et al. |
| 2005/0029491 A1 | | 2/2005 | Liu et al. |
| 2005/0031789 A1 | | 2/2005 | Liu et al. |
| 2005/0066585 A1 | | 3/2005 | Bian et al. |

FOREIGN PATENT DOCUMENTS

WO    WO 02/31072 A1    4/2002

* cited by examiner

Primary Examiner—Lee D. Wilson
Assistant Examiner—Anthony Ojini
(74) Attorney, Agent, or Firm—Edwin Oh

(57) ABSTRACT

The present invention provides a multi-step aqueous composition useful for polishing a tantalum barrier material and copper from a semiconductor wafer, comprising by weight percent 0.1 to 30 oxidizer, 0.01 to 3 inorganic salt or acid, 0.01 to 4 inhibitor, 0.1 to 30 abrasive, 0 to 15 complexing agent and balance water, wherein the aqueous composition has a pH between 1.5 to 6.

10 Claims, No Drawings

MULTI-STEP POLISHING SOLUTION FOR CHEMICAL MECHANICAL PLANARIZATION

BACKGROUND OF THE INVENTION

The invention relates to chemical mechanical planarization (CMP) of semiconductor wafer materials and, more particularly, to CMP compositions and methods for removing copper and barrier materials from semiconductor wafers.

Typically, a semiconductor wafer has a wafer of silicon and a dielectric layer containing multiple trenches arranged to form a pattern for circuit interconnects within the dielectric layer. The pattern arrangements usually have a damascene structure or dual damascene structure. A barrier layer covers the patterned dielectric layer and a metal layer covers the barrier layer. The metal layer has at least sufficient thickness to fill the patterned trenches with metal to form circuit interconnects.

CMP processes often include multiple polishing steps. For example, a "first step" removes a metal layer from underlying barrier layers. The first step polishing removes the metal layer, while leaving a smooth planar surface on the wafer with metal-filled trenches that provide circuit interconnects planar to the polished surface. First step polishing removes excess interconnect metals, such as copper at an initial high rate. After the first step removal, the "second step" polishing can remove a barrier that remains on the semiconductor wafer. This second step polishing removes the barrier from an underlying dielectric layer of a semiconductor wafer to provide a planar polished surface on the dielectric layer. Typically, first and second step polishing provide removal rates of about 2000 Å/min or more and about 1000 Å/min or less, respectively.

Unfortunately, these multiple polishing steps are very cost prohibitive and time consuming. In particular, the multiple polishing steps utilize different slurries or polishing solutions to selectively remove the unwanted portions. In other words, one slurry may be utilized for the "first step" and a second slurry may be utilized for the "second step". Furthermore, the first and second steps are typically performed on multiple platens, requiring the workpiece or wafer to be moved from one platen to another during subsequent polishing steps, unduly increasing the overall process time.

Holland et al. discloses, in U.S. Pat. No. 6,261,158, a multi-step CMP system for polishing metal and barrier materials. Holland attempts to minimize process time by performing the polishing on a single, combined platen. However, the system of Holland utilizes a "first slurry" and a "second slurry" for the removal of the respective materials (i.e., the metal and barrier materials). Accordingly, the system of Holland still suffers from the drawbacks of the prior art.

Hence, what is needed is an improved CMP composition and method for selectively removing copper and tantalum barrier materials. In particular, there is a need for a CMP composition and method for selectively removing copper and tantalum barrier materials that are cost effective to utilize and decreases the overall process time.

STATEMENT OF THE INVENTION

In a first aspect, the present invention provides a multi-step aqueous composition useful for polishing a tantalum barrier material and copper from a semiconductor wafer, comprising by weight percent 0.1 to 30 oxidizer, 0.01 to 3 inorganic salt or acid, 0.01 to 4 inhibitor, 0.1 to 30 abrasive, 0 to 15 complexing agent and balance water, wherein the aqueous composition has a pH between 1.5 to 6.

In a second aspect, the present invention provides a multi-step aqueous composition useful for polishing a tantalum barrier material and copper from a semiconductor wafer, comprising by weight percent 0.1 to 30 hydrogen peroxide, 0.01 to 3 inorganic salt or acid, 0.01 to 4 inhibitor, 0.1 to 30 abrasive, 0 to 15 complexing agent and balance water, the aqueous composition having a pH between 1.5 to 6, wherein the inorganic salt is selected from the group comprising: zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, zinc sulfate, zinc pyrosulfate, zinc polysulfate, zinc sulfonate, ammonium sulfate, ammonium pyrosulfate, ammonium polysulfate, ammonium sulfonate, diammonium sulfate, diammonium pyrosulfate, diammonium polysulfate, diammonium sulfonate, guanidine sulfate, guanidine pyrosulfate, guanidine polysulfate, guanidine sulfonate, iron sulfate, iron pyrosulfate, iron polysulfate, iron sulfonate, cerium sulfate, cerium pyrosulfate, cerium polysulfate, cerium sulfonate, ethylene-diamine sulfate, piperazine sulfate, piperazine pyrosulfate, piperazine sulfonate, melamine sulfate, dimelamine sulfate, melamine pyrosulfate, melamine polysulfate, melamine sulfonate, melam sulfate, melam pyrosulfate, melam polysulfate, melam sulfonate, melem sulfate, melem pyrosulfate, melem polysulfate, melem sulfonate, dicyanodiamide sulfate, urea sulfate, and their acids, salts, mixed acid salts, esters, partial esters, mixed esters, and mixtures thereof.

In a third aspect, the present invention provides a method for polishing a tantalum barrier material and copper from a semiconductor wafer comprising: contacting the wafer with a polishing composition, the wafer containing the tantalum barrier material and copper, the polishing composition comprising by weight percent 0.1 to 30 oxidizer, 0.01 to 3 inorganic salt or acid, 0.01 to 4 inhibitor, 0.1 to 30 abrasive, 0 to 15 complexing agent and balance water, wherein the aqueous composition has a pH between 1.5 to 6; and polishing the wafer with a polishing pad.

DETAILED DESCRIPTION

The solution and method provide unexpected removal rates for both copper and tantalum barrier materials. The solution relies upon an inorganic salt or acid and an oxidizer to selectively remove copper and tantalum barrier materials. The solution is cost effective to utilize and provides decreased overall process time.

For purposes of this specification, tantalum barrier refers to tantalum, tantalum- containing alloy, tantalum-base alloys and tantalum intermetallics. The solution has particular effectiveness for tantalum, tantalum-base alloys and tantalum internetallics, such as tantalum carbides, nitrides and oxides. In addition, although the present invention has particular usefulness in copper interconnects, the present aqueous polishing composition may also provide enhanced polishing of other metal interconnects, such as aluminum, nickel, silver, gold, platinum, palladium, beryllium, zinc, titanium, tungsten, chromium and the like. Further, for purposes of the specification, the term dielectric refers to a semi-conducting material of dielectric constant, k, which includes low-k and ultra-low k dielectric materials. For example, porous and nonporous low-k dielectrics, organic and inorganic low-k dielectrics, organic silicate glasses (OSG), fluorosilicate glass (FSG), carbon doped oxide (CDO), tetraethylorthosilicate (TEOS) and a silica derived from TEOS.

Also, for purposes of this specification, an "inorganic salt or acid" is preferably any compound containing a phosphorus or a sulfur atom, although other compounds may be utilized. A preferred phosphorus-containing or sulfur-containing compound is, for example, phosphate, pyrophosphate, polyphosphate, phosphonate, sulfate, pyrosulfate, polysulfate, sulfonate and their acids, salts, mixed acid salts, esters, partial esters, mixed esters, and mixtures thereof, for example, phosphoric acid.

In particular, a preferred aqueous polishing composition can be formulated using, for example, the following phosphorus-containing or sulfur-containing compounds: zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, zinc sulfate, zinc pyrosulfate, zinc polysulfate, zinc sulfonate, ammonium sulfate, ammonium pyrosulfate, ammonium polysulfate, ammonium sulfonate, diammonium sulfate, diammonium pyrosulfate, diammonium polysulfate, diammonium sulfonate, guanidine sulfate, guanidine pyrosulfate, guanidine polysulfate, guanidine sulfonate, iron sulfate, iron pyrosulfate, iron polysulfate, iron sulfonate, cerium sulfate, cerium pyrosulfate, cerium polysulfate, cerium sulfonate, ethylene-diamine sulfate, piperazine sulfate, piperazine pyrosulfate, piperazine sulfonate, melamine sulfate, dimelamine sulfate, melamine pyrosulfate, melamine polysulfate, melamine sulfonate, melam sulfate, melam pyrosulfate, melam polysulfate, melam sulfonate, melem sulfate, melem pyrosulfate, melem polysulfate, melem sulfonate, dicyanodiamide sulfate, urea sulfate, and their acids, salts, mixed acid salts, esters, partial esters, mixed esters, and mixtures thereof. A preferred phosphorus-containing compound is ammonium phosphate.

Advantageously, the inorganic salt or acid of the polishing composition of the present invention is present in an amount effective to polish both copper and tantalum barrier material, as desired. It is believed that even a trace amount of the inorganic salt or acid in the polishing composition is effective for polishing the copper and barrier material. A satisfactory polishing rate at acceptable polishing down force pressures is obtained by using the inorganic salt or acid in an amount of 0.01 to 3 weight percent of the composition. A preferred range for the inorganic salt or acid is 0.1 to 1 weight percent of the composition. Most preferably, the inorganic salt or acid is 0.3 to 0.6 weight percent of the composition.

Advantageously, the solution contains 0.1 to 30 weight percent oxidizer. Preferably, the oxidizer is in the range of 0.5 to 10 weight percent. The oxidizing agent can be at least one of a number of oxidizing compounds, such as hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens hypochlorites and a mixture thereof. Furthermore, it is often advantageous to use a mixture of oxidizer compounds. When the polishing slurry contains an unstable oxidizing agent such as, hydrogen peroxide, it is often most advantageous to mix the oxidizer into the slurry at the point of use.

The polishing composition contains 0.1 to 30 weight percent abrasive to facilitate copper and barrier layer removal. Within this range, it is desirable to have the abrasive present in an amount of greater than or equal to 0.3 weight percent, and preferably greater than or equal to 0.5 weight percent. Also, desirable within this range is an amount of less than or equal to 10 weight percent, and preferably less than or equal to 8 weight percent. Most preferably, the abrasive concentration is from 2 to 5 weight percent.

The abrasive has an average particle size of less than or equal to 100 nanometers (nm) for preventing excessive metal dishing and dielectric erosion. For purposes of this specification, particle size refers to the average particle size of the abrasive. More preferably, it is desirable to use a colloidal abrasive having an average particle size of less than or equal to 50 nm. Further, minimal dielectric erosion and metal dishing advantageously occurs with colloidal silica having an average particle size of less than or equal to 30 nm. Decreasing the size of the colloidal abrasive to less than or equal to 30 nm, tends to improve the selectivity of the polishing composition, but, it also tends to decrease the barrier removal rate. In addition, the preferred colloidal abrasive may include additives, such as dispersants, surfactants and buffers to improve the stability of the colloidal abrasive. One such colloidal abrasive is colloidal silica from Clariant S. A., of Puteaux, France.

The polishing composition includes the abrasive for "mechanical" removal of the copper and barrier layers. Example abrasives include inorganic oxides, inorganic oxides having hydroxide coatings, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), silica particles coated with aluminum hydrous oxide, ellipsoidal particles of different anisometry coated with silica, silica particles coated with ceria hydroxide particles or combinations comprising at least one of the foregoing oxides. Modified forms of these inorganic oxides, such as, polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles and coated polymeric particles. The preferred abrasive is silica.

Additionally, the solution contains 0.01 to 4 weight percent inhibitor to control interconnect removal rate by static etch or other removal mechanism. Adjusting the concentration of an inhibitor adjusts the interconnect metal removal rate by protecting the metal from static etch. Advantageously, the solution contains an optional 0.1 to 3 weight percent inhibitor for inhibiting static etch of, for example, copper interconnects. The inhibitor may consist of a mixture of inhibitors. Azole inhibitors are particularly effective for copper and silver interconnects. Typical azole inhibitors include benzotriazole (BTA), mercaptobenzothiazole (MBT), tolytriazole and imidazole. BTA is a particularly effective inhibitor for copper and silver.

The inorganic salt and oxidizer provide efficacy over a broad pH range in solutions containing a balance of water. This solution's useful pH range extends from at least 1.5 to 6. In addition, the solution advantageously relies upon a balance of deionized water to limit incidental impurities. The pH of the polishing solution of this invention is preferably from 1.8 to 4, more preferably from pH 2 to 3. The pH adjusting agents used to adjust the pH of the slurry of this invention may be a base containing ammonium ion, such as ammonium hydroxide, bases containing alkyl-substituted ammonium ions, bases containing alkali metal ion, bases containing alkali-earth metal ion, bases containing group IIIB metal ion, bases containing group IVB metal ion, bases containing group VB metal ion and salts containing transition metal ion. The designed pH in the acidic range is not only for removal of the copper and barrier surface, but also helpful for the slurry of this invention to be stable. For the polishing slurry, the pH may be adjusted by a known technique. For example, an alkali may be directly added to a slurry in which a silica abrasive is dispersed and an organic acid is dissolved. Alternatively, a part or all of an alkali to be added may be added as an organic alkali salt. Examples of an alkali, which may be used, include alkali metal hydroxides such as potassium hydroxide, alkali metal carbonates such as potassium carbonate, ammonia and amines. Advantageously, the addition of the inorganic salt or acid provides greater stability and robustness to the present composition. In particular, the addition of the inorganic salt or acid allows the present composition to provide effective polishing rates, substantially unaffected or independent of the pH.

The solution provides excellent removal rates for the interconnect metal and the barrier material. In particular, a multi-step polishing solution is utilized to remove the unwanted portions of the interconnect metal and the barrier material in a single, combined step. In other words, a single polishing solution of the present invention can be utilized in both the "first step" and the "second step" processes, thereby, eliminating additional costs and decreasing process time. In addition, the composition of the present invention can be utilized solely as a second step slurry, as desired. The solution relies upon an inorganic salt or acid and an oxidizer to selectively remove copper and tantalum barrier materials. In one embodiment, the present invention provides a multi-step aqueous composition useful for polishing a tantalum barrier material and copper from a semiconductor wafer, comprising by weight percent 0.1 to 30 oxidizer, 0.01 to 3 inorganic salt or acid, 0.01 to 4 inhibitor, 0.1 to 30 abrasive, 0 to 15 complexing agent and balance water, wherein the aqueous composition has a pH between 1.5 to 3.5.

Optionally, the solution may contain 0 to 15 weight percent complexing agent for the nonferrous metal. The complexing agent, when present, prevents precipitation of the metal ions formed by dissolving the nonferrous metal interconnects. Most advantageously, the solution contains 0 to 10 weight percent complexing agent for the nonferrous metal. Example complexing agents include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including, salts and mixtures thereof. Advantageously, the complexing agent is selected from the group consisting of acetic acid, citric acid, ethyl acetoacetate, glycolic acid, lactic acid, malic acid, oxalic acid and mixtures thereof. Most advantageously, the complexing agent is citric acid.

The polishing solution may also include levelers such as, ammonium chloride, to control surface finish of the interconnect metal. In addition to this, the solution optionally may contain a biocide for limiting biological contamination. For example, Kordek® MLX microbicide 2-Methyl-4-isothiazolin-3-one in water (Rohm and Haas Company) provides an effective biocide for many applications. The biocide is typically used in the concentration prescribed by the supplier.

The solution provides excellent removal rates for the interconnect metal and the barrier material. In particular, a multi-step polishing solution is utilized to remove the unwanted portions of the interconnect metal and the barrier material in a single, combined step. In other words, a single polishing solution of the present invention can be utilized in both the "first step" and the "second step" processes, thereby, eliminating additional costs and decreasing process time. In addition, the composition of the present invention can be utilized solely as a second step slurry, as desired. A particular polishing pad useful for determining the removal rates is the IC1010 polyurethane polishing pad (Rohm and Haas Electronic Materials CMP Technologies). Adjusting the inorganic salt or acid and oxidizer concentrations adjusts the removal rate of the interconnect metals and the barrier materials.

EXAMPLES

In the Examples, numerals represent examples of the invention and letters represent comparative examples. In addition, all example solutions contained 0.6 weight percent benzotriazole.

Example 1

This experiment measured removal rates of the tantalum nitride barrier and copper from a semiconductor wafer. In particular, the test determined the effect of varying concentrations of an inorganic salt, namely, ammonium dihydrogen phosphate, and an oxidizer, namely, hydrogen peroxide for use in a first and second step polishing operation. A Strausbaugh polishing machine using a IC1010 polyurethane polishing pad under downforce conditions of about 1.5 psi (10.3 kPa) and a polishing solution flow rate of 200 ml/min, a platen speed of 93 RPM and a carrier speed of 87 RPM planarized the samples. The polishing solutions had a pH of 2.5 adjusted with KOH and $HNO_3$. All solutions contained deionized water. In addition, polishing solutions included 4 weight percent silica abrasives having an average particle size of 25 nm.

TABLE 1

Polishing Results

| Test | $(NH_4)H_2PO_4$ (wt. %) | $H_2O_2$ (wt. %) | TaN Å/min | Cu Å/min |
|---|---|---|---|---|
| A | — | 9 | 243 | 258 |
| 1 | 0.1 | 9 | 131 | 1229 |
| 2 | 0.2 | 9 | 297 | 1723 |
| 3 | 0.3 | 9 | 533 | 2434 |
| 4 | 0.4 | 9 | 802 | 2634 |
| 5 | 0.5 | 9 | 913 | 3124 |
| 6 | 0.5 | 1 | 1072 | 194 |
| 7 | 0.5 | 2 | 1116 | 248 |
| 8 | 0.5 | 3 | 1134 | 434 |
| 9 | 0.5 | 5 | 1117 | 1515 |
| 10 | 0.5 | 7 | 989 | 2269 |

As illustrated in Table 1, the removal rates of the tantalum nitride barrier film and copper are highly adjustable utilizing the composition of the present invention, the removal rates being strongly dependent on the relative concentrations of the inorganic salt and the oxidizer. In particular, increasing the ammonium dihydrogen phosphate concentration from 0.1 to 0.5 weight percent, while maintaining the hydrogen peroxide at 9 weight percent, generally increased the removal rates of the tantalum nitride film from 131 Å/min to 913 Å/min, respectively. Also, increasing the hydrogen peroxide concentration from 1 to 7 weight percent, while maintaining the ammonium dihydrogen phosphate at 0.5 weight percent, increased the removal rates of the copper film from 194 Å/min to 2269 Å/min, respectively. A composition not containing ammonium dihydrogen phosphate (Test A) provided negligible removal rates for both the tantalum nitride and the copper. Test 2 provided a good removal rate for the copper while minimizing the removal rate of the tantalum nitride. Namely, in Test 2, the polishing solution provided a removal rate of 1723 Å/min for the copper film while minimizing the removal rate of the tantalum nitride to 297 Å/min. Test 6 provided a good removal rate for the tantalum nitride while minimizing the removal rate of the copper. Namely, in Test 6, the polishing solution provided a removal rate of 1072 Å/min for the tantalum nitride film while minimizing the removal rate of the copper to 194 Å/min. Tests 9 and 10 provided excellent removal rates for both the tantalum nitride and copper. In particular, Test 9 provided removal rates of 1117 Å/min for the tantalum nitride and 1515 Å/min for the copper. Similarly, Test 10 provided removal rates of 989 Å/min for the tantalum nitride and 2269 Å/min for the copper. Note, the removal rates discussed are at the test conditions for the Example as defined above. The removal rates may vary with changes made to the test parameters.

The results shown in Table 1 indicate that the polishing solution of the present invention can be ideally utilized for both first and second step polishing. The removal rates of the tantalum nitride barrier film and copper are highly tunable or adjustable utilizing the relative concentrations of the inorganic salt, namely, ammonium dihydrogen phosphate and the oxidizer, namely, hydrogen peroxide. For example, Test samples 9 and 10 are ideally suited as a first and second step polishing solution, providing excellent removal rates for both the copper and the tantalum nitride barrier. In particular, Test 9 provided removal rates of 1515 Å/min for the copper and 1117 Å/min for the tantalum nitride. Similarly, Test 10 provided removal rates 2269 Å/min for the copper and of 989 Å/min for the tantalum nitride. Alternatively, the composition of the present invention can be utilized solely as a second step slurry. For example, Test sample 6 provided excellent removal rates for the tantalum (1072 Å/min) while minimizing removal of copper (194 Å/min).

Example 2

This experiment measured removal rates of the tantalum nitride barrier and copper from a semiconductor wafer. In particular, the test determined the effect of varying concentrations of an inorganic acid, namely, hydrogen sulfate, and an oxidizer, namely, hydrogen peroxide for use in first and second step polishing operations. The test conditions were the same as that of Example 1 above.

TABLE 2

Polishing Results

| Test | $H_2SO_4$ (wt. %) | $H_2O_2$ (wt. %) | TaN Å/min | Cu Å/min |
|---|---|---|---|---|
| B | — | 9 | 340 | 219 |
| 11 | 0.13 | 9 | 768 | 1253 |
| 12 | 0.23 | 9 | 1322 | 1874 |
| 13 | 0.43 | 9 | 1405 | 2127 |
| 14 | 0.63 | 9 | 1365 | 2349 |
| 15 | 0.83 | 9 | 1385 | 3107 |
| 16 | 1.00 | 9 | 1313 | 3439 |
| 17 | 0.63 | 1 | 1501 | 156 |
| 18 | 0.63 | 2 | 1486 | 292 |
| 19 | 0.63 | 3 | 1368 | 305 |
| 20 | 0.63 | 5 | 1334 | 1298 |
| 21 | 0.63 | 7 | 1447 | 1446 |

As illustrated in Table 2, the removal rates of the tantalum nitride barrier film and copper are highly adjustable utilizing the composition of the present invention, the removal rates being strongly dependent on the relative concentrations of the inorganic acid and the oxidizer. In particular, increasing the hydrogen sulfate concentration from 0.13 to 1 weight percent, while maintaining the hydrogen peroxide at 9 weight percent, generally increased the removal rates of the tantalum nitride film from 768 Å/min to 1313 Å/min, respectively. Also, increasing the hydrogen peroxide concentration from 1 to 7 weight percent, while maintaining the hydrogen sulfate at 0.63 weight percent, increased the removal rates of the copper film from 156 Å/min to 1446 Å/min, respectively. A composition not containing hydrogen sulfate (Test B) provided negligible removal rates for both the tantalum nitride and the copper. Test 11 provided a good removal rate for the copper while minimizing the removal rate of the tantalum nitride. Namely, in Test 11, the polishing solution provided a removal rate of 1253 Å/min for the copper film while minimizing the removal rate of the tantalum nitride to 768 Å/min. Test 17 provided a good removal rate for the tantalum nitride while minimizing the removal rate of the copper. Namely, in Test 17, the polishing solution provided a removal rate of 1501 Å/min for the tantalum nitride film while minimizing the removal rate of the copper to 156 Å/min. Tests 13 and 14 provided excellent removal rates for both the tantalum nitride and copper. In particular, Test 13 provided removal rates of 1405 Å/min for the tantalum nitride and 2127 Å/min for the copper. Similarly, Test 14 provided removal rates of 1365 Å/min for the tantalum nitride and 2349 Å/min for the copper. Note, the removal rates discussed are at the test conditions for the Example as defined above. The removal rates may vary with changes made to the test parameters.

The results shown in Table 2 indicate that the polishing solution of the present invention can be ideally utilized for both first and second step polishing. The removal rates of the tantalum nitride barrier film and copper are highly tunable or adjustable utilizing the relative concentrations of the inorganic acid, namely, hydrogen sulfate and the oxidizer, namely, hydrogen peroxide. For example, Test samples 13 and 14 are ideally suited as a first and second step polishing solution, providing excellent removal rates for both the copper and the tantalum nitride barrier. Alternatively, the composition of the present invention can be utilized solely as a second step slurry. For example, Test sample 17 provided excellent removal rates for the tantalum (1501 Å/min) while minimizing removal of copper (156 Å/min).

Accordingly, the solution provides excellent removal rates for the interconnect metal and the barrier material. In particular, a multi-step polishing solution is utilized to remove the unwanted portions of the interconnect metal and the barrier material in a single, combined step. In other words, a single polishing solution of the present invention can be utilized in both the "first step" and the "second step" processes, thereby, eliminating additional costs and decreasing process time. In addition, the composition of the present invention can be utilized solely as a second step slurry, as desired. The solution relies upon an inorganic salt or acid and an oxidizer to selectively remove copper and tantalum barrier materials. In one embodiment, the present invention provides a multi-step aqueous composition useful for polishing a tantalum barrier material and copper from a semiconductor wafer, comprising by weight percent 0.1 to 30 oxidizer, 0.01 to 3 inorganic salt or acid, 0.01 to 4 inhibitor, 0.1 to 30 abrasive, 0 to 15 complexing agent and balance water, wherein the aqueous composition has a pH between 1.5 to 6.

What is claimed is:

1. A multi-step aqueous composition useful for polishing a tantalum barrier material and copper from a semiconductor wafer, comprising by weight percent 0.1 to 30 oxidizer, 0.01 to 3 inorganic salt or acid, 0.01 to 4 inhibitor, 0.1 to 30 abrasive, 0 to 15 complexing agent and balance water, wherein the aqueous composition has a pH between 1.5 to 6.

2. The composition of claim 1 wherein the composition comprises 0.1 to 1 weight percent inorganic salt.

3. The composition of claim 1 wherein the aqueous composition has a pH between 2 to 3.

4. The composition of claim 1 wherein the inorganic salt is selected from the group comprising: phosphate, pyrophosphate, polyphosphate, phosphonate, sulfate, pyrosulfate, polysulfate, sulfonate and their acids, salts, mixed acid salts, esters, partial esters, mixed esters, and mixtures thereof.

5. The composition of claim 1 wherein the inorganic salt is selected from the group comprising: zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, zinc sulfate, zinc pyrosulfate, zinc polysulfate, zinc sulfonate, ammonium sulfate, ammonium pyrosulfate, ammonium polysulfate, ammonium sulfonate, diammonium sulfate, diammonium pyrosulfate, diammonium polysulfate, diammonium sulfonate, guanidine sulfate, guanidine pyrosulfate, guanidine polysulfate, guanidine sulfonate, iron sulfate, iron pyrosulfate, iron polysulfate, iron sulfonate, cerium sulfate, cerium pyrosulfate, cerium polysulfate, cerium sulfonate, ethylene-diamine sulfate, piperazine sulfate, piperazine pyrosulfate, piperazine sulfonate, melamine sulfate, dimelamine sulfate, melamine pyrosulfate, melamine polysulfate, melamine sulfonate, melam sulfate, melam pyrosulfate, melam polysulfate, melam sulfonate, melem sulfate, melem pyrosulfate, melem polysulfate, melem sulfonate, dicyanodiamide sulfate, urea sulfate, and their acids, salts, mixed acid salts, esters, partial esters, mixed esters, and mixtures thereof.

6. The composition of claim 1 wherein the oxidizer is selected from the group comprising: hydrogen peroxide, monopersulfates, iodates, magnesium perphthalate, peracetic acid, persulfates, bromates, periodates, nitrates, iron salts, cerium salts, Mn (III), Mn (IV) and Mn (VI) salts, silver salts, copper salts, chromium salts, cobalt salts, halogen hypochlorites and a mixture thereof.

7. A multi-step aqueous composition useful for polishing a tantalum barrier material and copper from a semiconductor wafer, comprising by weight percent 0.1 to 30 hydrogen peroxide, 0.01 to 3 inorganic salt or acid, 0.01 to 4 inhibitor, 0.1 to 30 abrasive, 0 to 15 complexing agent and balance water, the aqueous composition having a pH between 1.5 to 6, wherein the inorganic salt is selected from the group comprising: zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, zinc sulfate, zinc pyrosulfate, zinc polysulfate, zinc sulfonate, ammonium sulfate, ammonium pyrosulfate, ammonium polysulfate, ammonium sulfonate, diammonium sulfate, diammonium pyrosulfate, diammonium polysulfate, diammonium sulfonate, guanidine sulfate, guanidine pyrosulfate, guanidine polysulfate, guanidine sulfonate, iron sulfate, iron pyrosulfate, iron polysulfate, iron sulfonate, cerium sulfate, cerium pyrosulfate, cerium polysulfate, cerium sulfonate, ethylene-diamine sulfate, piperazine sulfate, piperazine pyrosulfate, piperazine sulfonate, melamine sulfate, dimelamine sulfate, melamine pyrosulfate, melamine polysulfate, melamine sulfonate, melam sulfate, melam pyrosulfate, melam polysulfate, melam sulfonate, melem sulfate, melem pyrosulfate, melem polysulfate, melem sulfonate, dicyanodiamide sulfate, urea sulfate, and their acids, salts, mixed acid salts, esters, partial esters, mixed esters, and mixtures thereof.

8. A method for polishing a tantalum barrier material and copper from a semiconductor wafer comprising:
contacting the wafer with a polishing composition, the wafer containing the tantalum barrier material and copper, the polishing composition comprising by weight percent 0.1 to 30 oxidizer, 0.01 to 3 inorganic salt or acid, 0.01 to 4 inhibitor, 0.1 to 30 abrasive, 0 to 15 complexing agent and balance water, wherein the aqueous composition has a pH between 1.5 to 6; and polishing the wafer with a polishing pad.

9. The method of claim 8 wherein the inorganic salt is selected from the group comprising: zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, zinc sulfate, zinc pyrosulfate, zinc polysulfate, zinc sulfonate, ammonium sulfate, ammonium pyrosulfate, ammonium polysulfate, ammonium sulfonate, diammonium sulfate, diammonium pyrosulfate, diammonium polysulfate, diammonium sulfonate, guanidine sulfate, guanidine pyrosulfate, guanidine polysulfate, guanidine sulfonate, iron sulfate, iron pyrosulfate, iron polysulfate, iron sulfonate, cerium sulfate, cerium pyrosulfate, cerium polysulfate, cerium sulfonate, ethylene-diamine sulfate, piperazine sulfate, piperazine pyrosulfate, piperazine sulfonate, melamine sulfate, dimelamine sulfate, melamine pyrosulfate, melamine polysulfate, melamine sulfonate, melam sulfate, melam pyrosulfate, melam polysulfate, melam sulfonate, melem sulfate, melem pyrosulfate, melem polysulfate, melem sulfonate, dicyanodiamide sulfate, urea sulfate, and their acids, salts, mixed acid salts, esters, partial esters, mixed esters, and mixtures thereof.

10. The method of claim 8 wherein the oxidizer is selected from the group comprising: hydrogen peroxide, monopersulfates, iodates, magnesium perphthalate, peracetic acid, persulfates, bromates, periodates, nitrates, iron salts, cerium salts, Mn (III), Mn (IV) and Mn (VI) salts, silver salts, copper salts, chromium salts, cobalt salts, halogen hypochlorites and a mixture thereof.

\* \* \* \* \*

US006971945C1

(12) EX PARTE REEXAMINATION CERTIFICATE (9770th)
United States Patent
Liu et al.

(10) Number: US 6,971,945 C1
(45) Certificate Issued: Jul. 26, 2013

(54) MULTI-STEP POLISHING SOLUTION FOR CHEMICAL MECHANICAL PLANARIZATION

(75) Inventors: Zhendong Liu, Newark, DE (US); John Quanci, Haddonfield, NJ (US); Robert E. Schmidt, Bear, DE (US); Terence M. Thomas, Newark, DE (US)

(73) Assignee: Rohm and Haas Electronic Materials CMP Holdings, Inc., Wilmington, DE (US)

Reexamination Request:
No. 90/012,154, Feb. 20, 2012

Reexamination Certificate for:
Patent No.: 6,971,945
Issued: Dec. 6, 2005
Appl. No.: 10/785,362
Filed: Feb. 23, 2004

(51) Int. Cl.
*B24B 1/00* (2006.01)

(52) U.S. Cl.
USPC ............ 451/41; 451/36; 451/54; 451/65; 252/79.1; 438/692; 438/693; 51/308; 51/309

(58) Field of Classification Search
None
See application file for complete search history.

(56) References Cited

To view the complete listing of prior art documents cited during the proceeding for Reexamination Control Number 90/012,154, please refer to the USPTO's public Patent Application Information Retrieval (PAIR) system under the Display References tab.

*Primary Examiner* — Timothy Speer

(57) ABSTRACT

The present invention provides a multi-step aqueous composition useful for polishing a tantalum barrier material and copper from a semiconductor wafer, comprising by weight percent 0.1 to 30 oxidizer, 0.01 to 3 inorganic salt or acid, 0.01 to 4 inhibitor, 0.1 to 30 abrasive, 0 to 15 complexing agent and balance water, wherein the aqueous composition has a pH between 1.5 to 6.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-10 are cancelled.

\* \* \* \* \*